US006255157B1

(12) United States Patent
Hsu et al.

(10) Patent No.: US 6,255,157 B1
(45) Date of Patent: Jul. 3, 2001

(54) METHOD FOR FORMING A FERROELECTRIC CAPACITOR UNDER THE BIT LINE

(75) Inventors: Louis L. Hsu, Fishkill; David E. Kotecki, Hopewell Junction; Jack A. Mandelman, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/238,853

(22) Filed: Jan. 27, 1999

(51) Int. Cl.[7] ............... H01L 21/8242; H01L 21/00; H01L 21/20; H01L 29/76
(52) U.S. Cl. .................. 438/239; 438/3; 438/253; 438/396; 257/295; 257/306
(58) Field of Search ................... 438/239, 240, 438/238, 241, 250, 253, 254, 393, 396, 3; 257/295, 306

(56) References Cited

U.S. PATENT DOCUMENTS

| 5,293,510 | 3/1994 | Takenaka . |
| 5,357,460 | 10/1994 | Yusuki et al. . |
| 5,371,699 | 12/1994 | Larson . |
| 5,382,817 | 1/1995 | Kashihara et al. . |
| 5,416,735 | 5/1995 | Onishi et al. . |
| 5,475,248 | 12/1995 | Takenaka . |
| 5,495,117 | 2/1996 | Larson . |
| 5,498,569 | * 3/1996 | Eastep ........................ 437/187 |
| 5,508,953 | 4/1996 | Fukuda et al. . |
| 5,535,154 | 7/1996 | Kiyono . |
| 5,541,807 | 7/1996 | Evans, Jr. et al. . |
| 5,561,307 | 10/1996 | Mihara et al. . |
| 5,578,867 | 11/1996 | Argos, Jr. et al. . |
| 5,638,319 | 6/1997 | Onishi et al. . |
| 5,679,969 | 10/1997 | Evans, Jr. et al. . |
| 5,696,394 | 12/1997 | Jones, Jr. et al. . |
| 5,708,284 | 1/1998 | Onishi . |
| 5,719,416 | 2/1998 | Yoshimori et al. . |
| 5,926,709 | * 7/1999 | Aisou et al. ............... 436/253 |

OTHER PUBLICATIONS

J. Kudo, et al., "A High Stability Electrode Technology for Stacked SrBi2Ta2O9 Capacitors . . . ", IEDM, 1997, pp. 609–612.

T. Yamazaki, et al., "Advanced 0.5μm FRAM Device Technology with Full Compatibility . . . ", IEDM, 1997, pp. 613–616.

* cited by examiner

Primary Examiner—Matthew Smith
Assistant Examiner—Lex H. Malsawma
(74) Attorney, Agent, or Firm—McGinn & Gibb, PLLC; Todd M. C. Li

(57) ABSTRACT

A structure and method for forming an integrated circuit structure including forming at least one transistor structure, forming at least one ferroelectric capacitor above the transistor structure, annealing the ferroelectric capacitor, and forming at least one conductive contact between the transistor structure and the ferroelectric capacitor.

14 Claims, 4 Drawing Sheets

METHOD FOR FORMING A FERROELECTRIC CAPACITOR UNDER THE BIT LINE

BACKGROUND OF THE INVENTION

1. Field of the Invention

The present invention generally relates to ferroelectric dielectrics and more specifically to a ferroelectric capacitor that is annealed before the bitline is formed and which is formed over the active area to reduce the size of the memory cell.

2. Description of the Related Art

Ferroelectric dielectrics are being actively investigated for use in a non-volatile memory devices and high-dielectric materials are being actively investigated for use in DRAM (Dynamic Random Access Memory) devices. In such devices, a capacitor is fabricated by depositing a thin film of a ferroelectric material such as $SrBi_2Ta_2O_9$(SBT),$Pb(Zr,Ta)O_3$(lead zirronate titanate), or their many variations, or a high-dielectric material such as $(Ba,Sr)TiO_3$(KST) between 2 electrodes. The electrodes are either noble metals (Ir, Pt, Ru, Pd, Au) or noble metal oxides ($RuO_2, IrO_2, \ldots$). In the completed device, one electrode is connected to a transfer device while the other electrode serves as a common reference plate or a drive line.

More specifically, FIG. 1 illustrates an N-type substrate 10 having a N+ diffusion region 11, an insulating layer 12 and a polysilicon plug 13 within the insulating layer 12. Further, the structure shown and FIG. 1 includes a barrier layer 14, top and bottom electrodes 15, the ferroelectric 16 and an insulator 17.

FIG. 2 illustrates a bit line 20, a word line 21, a tungsten plug 22, a top electrode 23 and a bottom electrode 24 on either side of a ferroelectric 25. The tungsten plug 22 is connected to the top electrode 23 by a local interconnect 26.

One problem that occurs when fabricating such conventional devices is the high temperature anneal required to form the correct phase of the ferroelectric dielectric. This anneal typically requires a temperature of 700–850° C. in an oxidizing ambient. Since the noble metal or noble metal oxide electrodes are not good diffusion barriers for oxygen, any conductor connected to the electrode will have a tendency to be oxidized during this anneal. Therefore, such conventional structures are very difficult to produce and have a high defect rate associated with the high-temperature anneal.

For example, with the structure shown in FIG. 1, the conductor 13 is below the ferroelectric 16 and must be formed before the ferroelectric 16. Therefore, during the anneal of the ferroelectric the conductor 13 may be oxidized, which reduces the electrical conductivity between the electrodes 15 and the conductor 13, decreases device performance and increases defect rates.

While the local interconnect 26 shown in FIG. 2 is positioned above the top electrode 23 and can be formed after the ferroelectric 25 is annealed, the capacitor 25 is not formed over the device 21 resulting in a large cell size.

The invention overcomes the foregoing problems by forming the ferroelectric in a processed which avoids oxidation of the conductive paths to the electrodes of the ferroelectric capacitor, and still provides a small cell size, as discussed in greater detail below.

SUMMARY OF THE INVENTION

It is, therefore, an object of the present invention to provide a structure and method for forming an integrated circuit structure including forming at least one transistor structure, forming at least one ferroelectric capacitor above the transistor structure, annealing the ferroelectric capacitor, and forming at least one contact line between the transistor structure and the ferroelectric capacitor.

The forming of the ferroelectric capacitor includes depositing an insulator above the transistor structure, depositing a lower electrode above the insulator, depositing a ferroelectric material above the lower electrode, and depositing an upper electrode above the ferroelectric material. Before the depositing of the ferroelectric material, a portion of the lower electrode above the transistor structure is removed so as to form a recess in the ferroelectric material and the upper electrode.

Contact line openings are formed through the ferroelectric capacitor and insulating spacers are formed in the contact line openings above the lower electrode to insulate the ferroelectric material and the upper electrode from the contact line and to allow the lower electrode to contact the contact line. Further, there is an insulator formed above the ferroelectric capacitor. The ferroelectric material comprises $SrBi_2Ta_2O_9$(SBT), or its may variations, or $Pb(Zr,Ti)O_3$, (PZT), or its many variations, or a high-dielectric material such as $(Ba, Sr)TiO_3$(KST).

The contact plug electrically connects a diffusion region of the transistor and a lower electrode of the ferroelectric capacitor.

The invention does not suffer the problem of conventional structures, discussed in the Background section, in that the bitline will not be oxidized during the anneal of the ferroelectric material because the ferroelectric material is annealed before the deposition of the bitline material.

Further, the invention produces a structure wherein the ferroelectric capacitor is formed directly above the transistor structure. The structure is extremely economical with space and reduces the overall size of the integrated circuit device.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Because of the problem of interconnection paths oxidizing during the anneal of conventional ferroelectric and high-dielectric capacitors, discussed above, the invention includes a process sequence where the ferroelectric capacitor is fabricated and annealed prior to the formation of any electrical connection to either electrode of the capacitor. Secondly, the invention fabricates the capacitor in such a way that the cell size is minimized in order to increase the memory density.

More specifically, the invention fabricates a ferroelectric capacitor in a memory device using a process where the capacitor structure is completed prior to having an electrical connection to either electrode and where the capacitor is formed over the active area such that the size of the memory cell is minimized.

Figure 1:
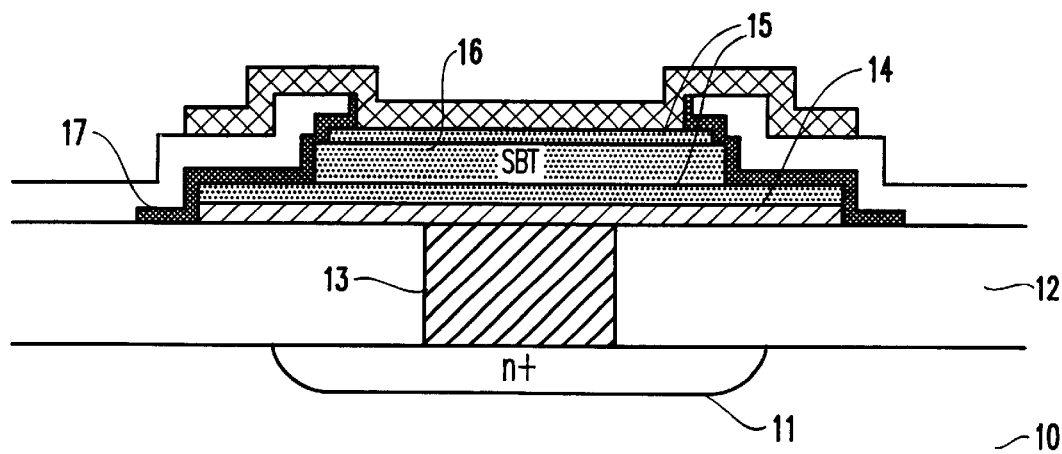
FIG. 1 is a schematic diagram of a conventional ferroelectric structure.
Figure 2:
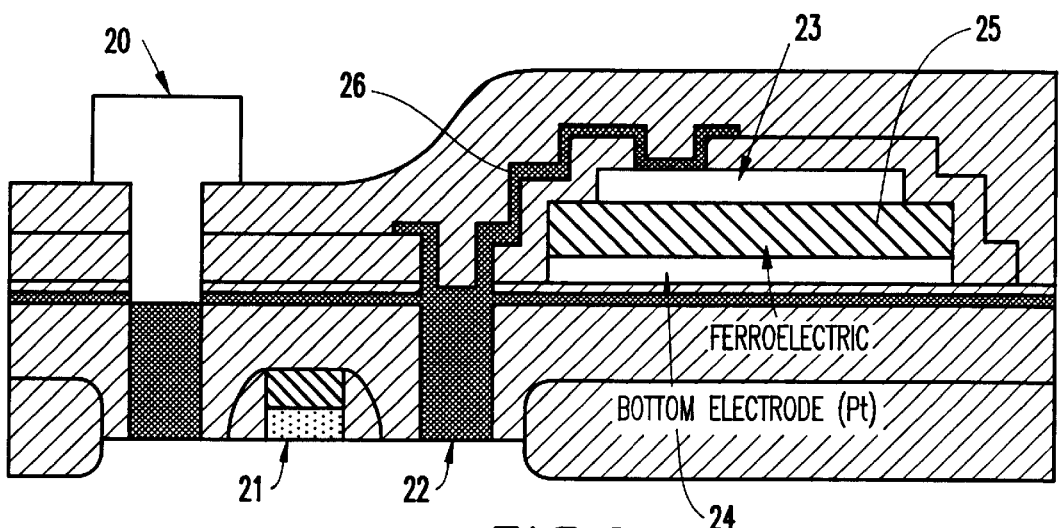
FIG. 2 is a schematic diagram of a conventional ferroelectric structure.
Figure 3:
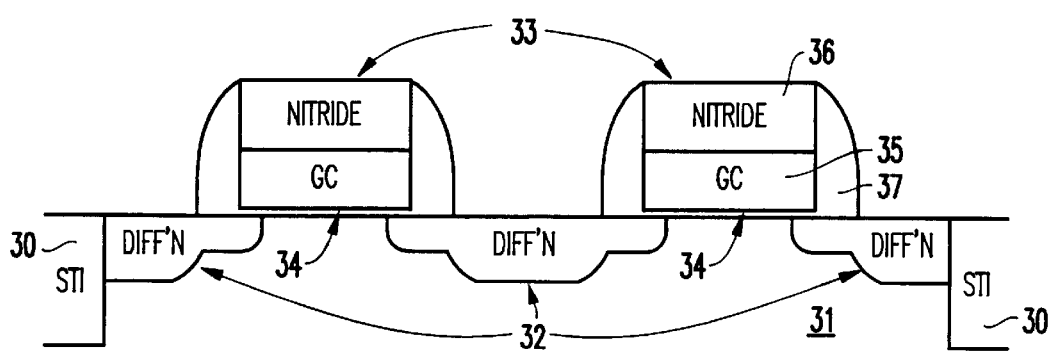
FIG. 3 is a schematic diagram of a partially completed ferroelectric structure according to the invention.

As shown in FIG. 3, an integrated circuit transistor structure includes a shallow trench isolation (STI) 30 region formed in a substrate 31 using well known conventional etching and deposition processes. The shallow trench isolation material may formed, for example, using a low temperature chemical vapor deposition (CVD) process of tetraethylorthosilicate (TEOS).

In addition, the substrate 31 includes diffusion regions 32 formed by implanting or transferring an impurity into the substrate 31, again using conventional techniques well known to those ordinarily skilled in this art field.

FIG. 3 also illustrates gate stacks 33 which include a gate oxide layer 34, a gate conductor layer 35 and a nitride cap 36, all of which are deposited and patterned using conventional deposition and patterning techniques well known to those ordinarily skilled in the art. In addition, insulating spacers 37 are formed adjacent the gate stack 33, again using conventional deposition and removal techniques, such as reactive ion etching (RIE).

Figure 4:
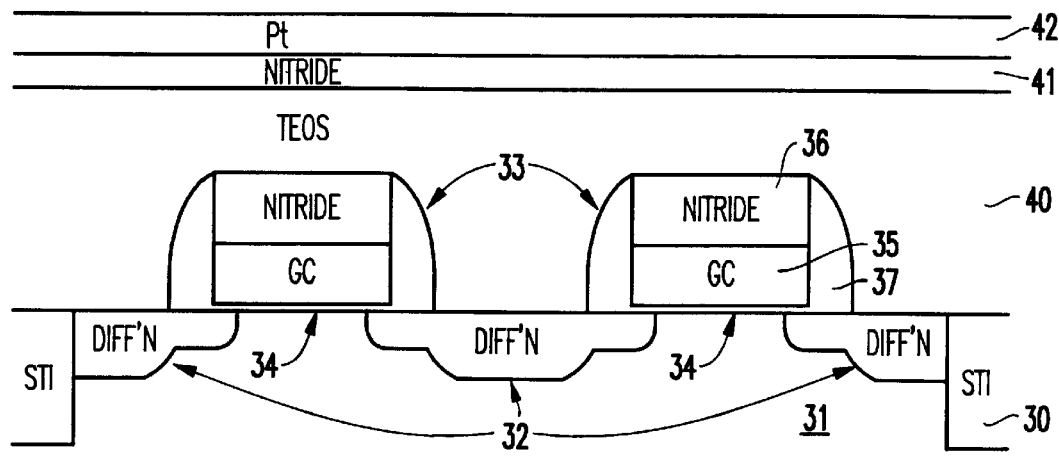
FIG. 4 is a schematic diagram of a partially completed ferroelectric structure according to the invention.

As shown in FIG. 4, a series of planar layers are formed over the gate stack structure shown in FIG. 3. More specifically, a low temperature chemical vapor deposition (CVD) process is used, for example, to form an insulating layer 40 of, for example, tetraethylorthosilicate (TEOS), boron phosphorous silicate glass (BPSG) or other similar insulator. The insulating layer 40 is formed to have a thickness within the range of 500 Å to 3000 Å and preferably to a thickness of 1000 Å, above the gate stack 36.

Then, a thinner insulating layer, such as silicon nitrite layer, or other insulating layer such as $TiO_2, ZrO_2, Al_2O_3$, is deposited using, for example a CVD process which forms a planar thinner insulating layer 41 over the insulator layer 40. The thinner insulating layer 41 may also be planarized using, for example, chemical mechanical polishing (CMP). The thinner insulating layer 41 is formed to have a thickness within the range of 100 Å to 1000 Å and preferably to a thickness of 200 Å.

Then, the bottom electrode 42 is deposited over the insulating layer 41, again using a conventional deposition process, such as physical vapor deposition (PVD) or chemical vapor deposition (CVD). The bottom electrode 42 comprises any suitable conductor such as Pt, Ru, Ag, Pd, $RuO_2$, $IrO_2$ and is formed to have a thickness within the range of 400 Å to 4000 Å and preferably to a thickness of 2000 Å.

Figure 5:
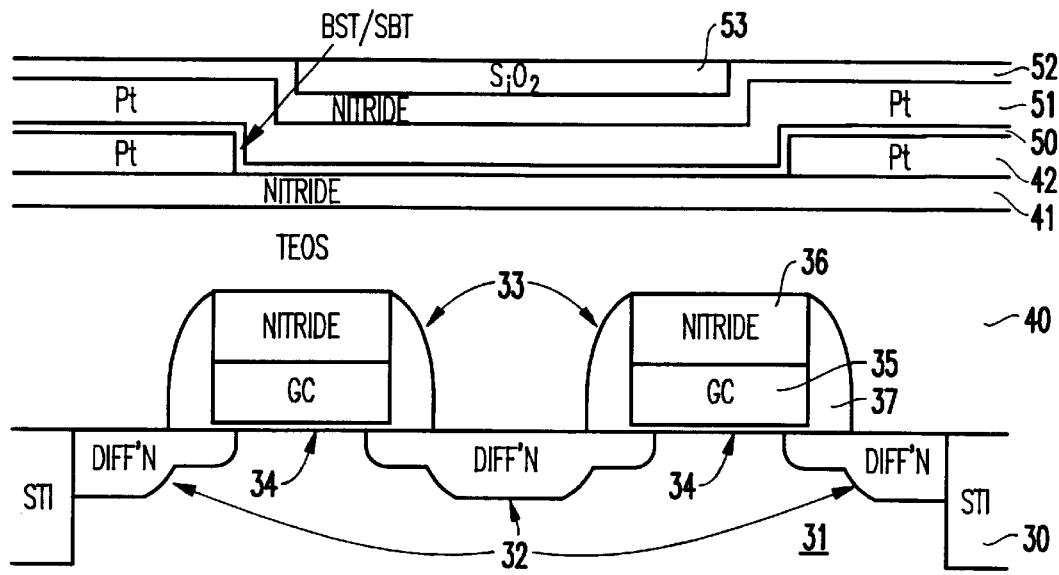
FIG. 5 is a schematic diagram of a partially completed ferroelectric structure according to the invention.

In FIG. 5, the bottom electrode 42 is patterned to expose layer 41 in an area above the gate conductor stacks using lithography and etching. The etching can be performed by either reactive ion etching or ion beam sputtering. The area of the bottom electrode 42 is preferably large enough to extend above the gate stack structures, yet does not extend to areas where bitline contacts.

A ferroelectric dielectric 50 such as $SrBi_2Ta_2O_9$(SBT), or its many variations, or Pb $(Zr,Ti)O_3$, or its variations, is conformally deposited by metal organic chemical vapor deposition (MOCVD), physical vapor deposition (PVD), or a chemical solution deposition (CSD) technique with MOCVD being the preferred deposition method. The ferroelectric dielectric 50 is formed over the areas of the bottom electrode 42 which were not patterned and over the area of the thin insulating layer 41 that was exposed by the patterning of the bottom electrode 42.

An upper electrode 51 is then deposited over the ferroelectric material 50 using well known processes, such as those described above with respect to the lower electrode 42. Then, another thin insulating layer 52, such as a silicon nitride or oxide is deposited in a similar manner as the first thin insulating layer 41.

The removal of the portions of the lower electrode 42 causes each succeeding layer to have a recess along the areas where the lower electrode was removed. This recess above the insulating layer 52 is filled with another insulator 53 and the entire structure is planarized using conventional planarization techniques, for example, chemical mechanical polishing (CMP). Similarly, the insulator 53 comprises any common insulating material, such as those discussed above. The recess accomplishes a number of functions. First, the recess increases surface area of the capacitor 50. Secondly, the recess insurers that the lower electrodes 42 do not contact the central plug 71 (shown in FIG. 7 and discussed in more detail below).

The ferroelectric structure is then annealed at high temperatures in the range of 600 to 850° C. and preferably at approximately 750° C. in an oxidizing ambient, as discussed above. One reason why the invention is fundamentally different than conventional structures/systems is because at the point where the ferroelectric capacitor is annealed, no conductive paths to the capacitor electrode are yet formed. Instead, as discussed in detail below, the various contracts to the upper and lower electrodes are formed after the annealing process, as shown, for example, in FIG. 7.

Figure 6:
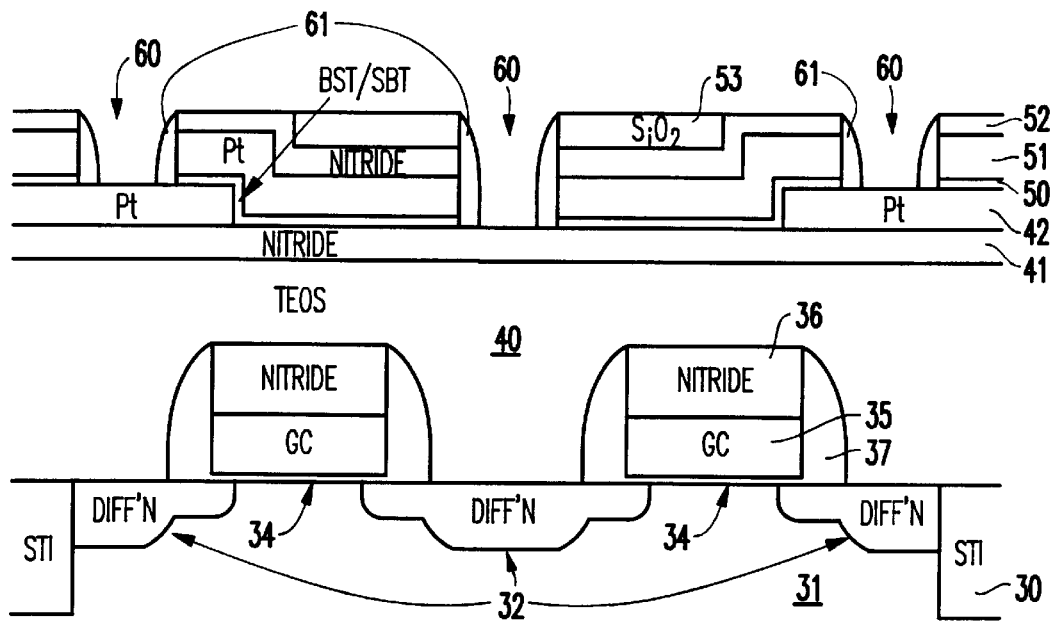
FIG. 6 is a schematic diagram of a partially completed ferroelectric structure according to the invention.

As shown in FIG. 6, opening's 60 are formed through the insulating layers 53, and 52, the upper electrode 51 and the ferroelectric material 50 using conventional lithographic masking and etching techniques, such as reactive ion etching. Sidewall spacers 61 are then formed along the walls of the opening 60 by depositing and etching an insulating material, such as those discussed above. The sidewall spacers 61 are preferably formed of silicon oxide or silicon nitride and can have a thickness in the range of between about 50 Å to 500 Å and more preferably about 150 Å.

For example, the sidewall spacers 61 can be formed by depositing a low temperature silicon oxide and anisotropically etching back the silicon oxide. The silicon oxide could be formed using a chemical vapor deposition (CVD) using tetraethoxysilane (TEOS) at a temperature in the range of about 650° to 900° C., or a plasma enhanced chemical vapor deposition (PECVD) process in the temperature range of 200–600° C. The anisotropic etching could be performed in a low pressure reactive ion etcher. Such etching removes the horizontal surfaces at a much higher rate (e.g., 100 times) than it removes the vertical surfaces, allowing the sidewall spacers to remain after the etching process.

Figure 7:
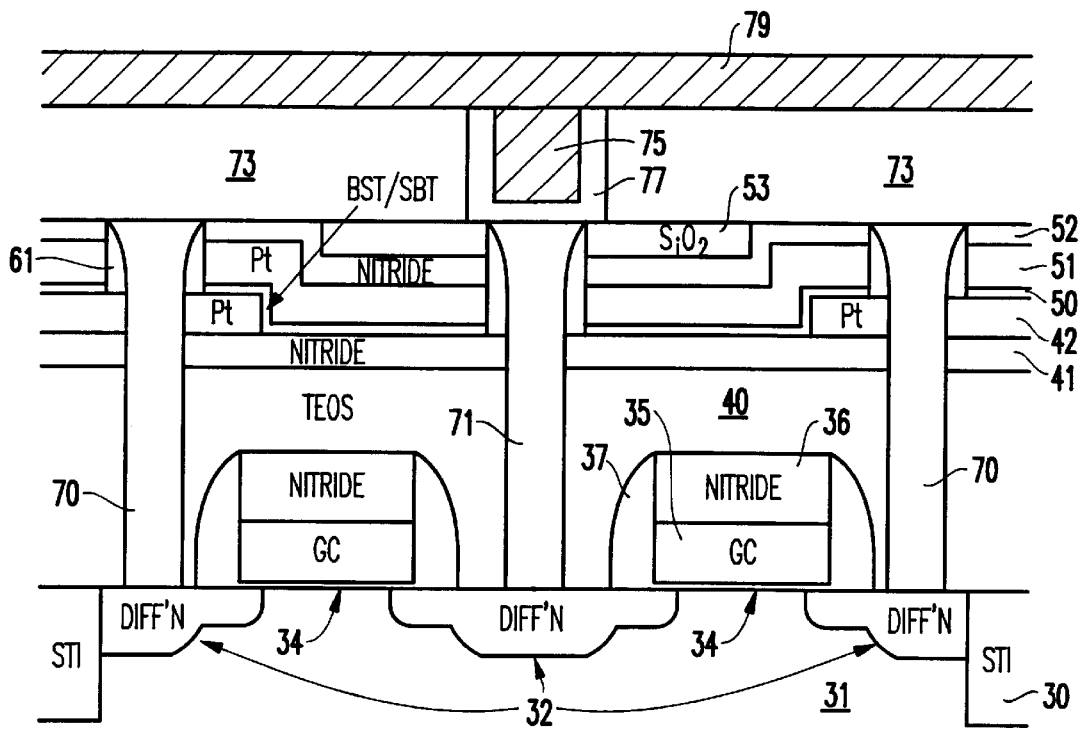
FIG. 7 is a schematic diagram of a ferroelectric structure according to the invention.

As shown and FIG. 7, the openings 60 are extended down to the diffusion regions 32 of the transistor structure (FIG. 3), again with conventional masking and etching techniques using, for example, a hard mask. The openings 60 are then filled with a conductive material such as metal (e.g., tungsten), metal alloy, doped amorphous or polycrystalline silicon or similar conductor. The structure is then planarized again using conventional planarization techniques.

The conductive material forms electrical contacts 70, 71, such as bitline contacts, with the underlying transistor structure. The conductive paths (e.g., "plugs") 70, 71 are insulated from the upper electrode 51 by the spacers 61. The outer plugs 70 are in contact with the lower electrode 42. However, the center contact 71 is isolated from both the upper or lower electrode 42, 51.

A dielectric layer 73 is deposited by conventional techniques such as plasma enhanced chemical vapor deposition. The thickness of the dielectric layer 73 is in the range of 500–3000 Å, with 1000 Å being preferred.

A contact opening is patterned into layer 73 using lithography and reaction ion etching, and filled with a conducting material 75 such as W, Al, $WSi_x$, doped polysilicon, etc. A liner material 77 may or may not be deposited between conductor 75 and conductor 71 depending upon the specific requirements of a given application. A bitline 79 is formed by depositing a metal layer such as Al, W, $WSi_x$, or $C_u$ and patterning using lithography and reactive ion etching. As would be known to one ordinarily skilled in the art given this disclosure, additional levels of metal wiring may be placed above the bitline using conventional techniques to complete the structure.

Figure 8:
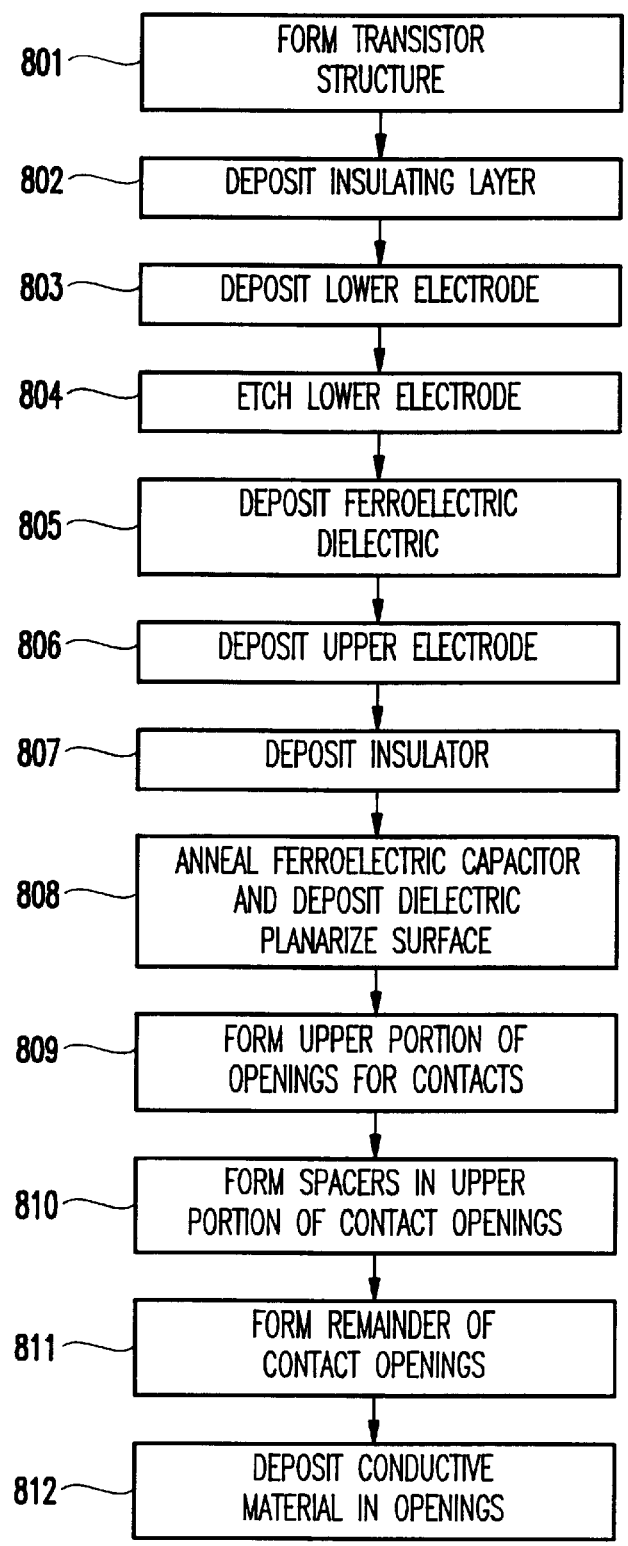
FIG. 8 is a flow diagram illustrating a preferred method of the invention.

FIG. 8 is a flowchart representation of the invention. More specifically, the transistor structure shown in FIG. 3 is formed 801. Then the insulating layers 40, 41 are formed 802. The lower electrode 42 is then deposited 803 and etched 804. The ferroelectric dielectric 50 is deposited over the etched lower electrode 805. The upper electrode 51 is deposited 806 and an insulator 52, 53 is deposited 807.

Then the structure is heated to anneal the ferroelectric capacitor 808. The upper portions of the openings for the contacts 60 are then formed 809 and spacers 61 are formed in the upper portion of the contract openings 810. As shown in FIG. 7, the remainder of the contract openings are formed 811 and conductive material 70, 71 is deposited in the openings 812.

The invention does not suffer the problem of conventional structures, discussed in the Background section, in that the contacts 70, 71 will not be oxidized during the anneal of the ferroelectric material 51 because the ferroelectric material 51 is annealed before the deposition of the bitline material 70.

Further, the inventive method produces a structure wherein the ferroelectric capacitor 42, 50, 51 is formed directly above the transistor structure (FIG. 3). Also, the invention forms the plugs 70, 71 directly through the capacitor 50. Thus, the structure is extremely economical with space and reduces the overall size of the integrated circuit device. Another advantage is that, after capacitor formation, the array area and support area are fully planarized with each other.

While the invention has been described in terms of preferred embodiments, those skilled in the art will recognize that the invention can be practiced with modification within the spirit and scope of the appended claims.

What is claimed is:

1. A method for forming an integrated circuit structure, said method comprising:
   forming at least one transistor structure;
   forming at least one ferroelectric capacitor above said transistor structure;
   annealing said ferroelectric capacitor; and
   forming at least one substantially axial forming conductive contact between said transistor structure and said ferroelectric capacitor, wherein said conductive contact is formed through said ferroelectric capacitor.

2. The method in claim 1, wherein said forming of said ferroelectric capacitor comprises:
   depositing an insulator above said transistor structure;
   depositing a lower electrode above said insulator;
   depositing a ferroelectric material above said lower electrode; and
   depositing an upper electrode above said ferroelectric material.

3. The method in claim 2, wherein said ferroelectric material comprises one of $SrBi_2Ta_2O_9$(SBT) and $Pb(Zr,Ti)O_3$, (PZT).

4. The method in claim 1, further comprising forming an insulator above said ferroelectric capacitor.

5. The method in claim 1, wherein said forming of said conductive contact electrically connects a diffusion region of said transistor and a lower electrode of said ferroelectric capacitor.

6. A method for forming an integrated circuit structure, said method comprising:
   forming at least one transistor structure;
   forming at least one ferroelectric capacitor above said transistor structure by:
     depositing an insulator above said transistor structure,
     depositing a lower electrode above said insulator,
     removing a portion of said lower electrode above said transistor structure so as to form a recess in said ferroelectric material and said upper electrode,
     depositing a ferroelectric material above said lower electrode, and
     depositing an upper electrode above said ferroelectric material;
   annealing said ferroelectric capacitor; and
   forming at least one conductive contact between said transistor structure and said ferroelectric capacitor.

7. A method for forming an integrated circuit structure, said method comprising:
   forming at least one transistor structure;
   forming at least one ferroelectric capacitor above said transistor structure by:
     depositing an insulator above said transistor structure,
     depositing a lower electrode above said insulator,
     depositing a ferroelectric material above said lower electrode, and
     depositing an upper electrode above said ferroelectric material;
   annealing said ferroelectric capacitor;
   forming conductive contact openings through said ferroelectric capacitor and forming insulating spacers in said conductive contact openings above said lower electrode to insulate said ferroelectric material and said upper electrode from at least one conductive contact to be formed and to allow said lower electrode to contact said at least one conductive contact to be formed; and
   forming said at least one conductive contact between said transistor structure and said ferroelectric capacitor.

8. An integrated circuit structure produced by a process comprising:
   forming at least one transistor structure;
   forming at least one ferroelectric capacitor above said transistor structure;
   annealing said ferroelectric capacitor; and
   forming at least one substantially axial forming conductive contact between said transistor structure and said ferroelectric capacitor, wherein said conductive contact is formed through said ferroelectric capacitor.

9. The integrated circuit structure in claim 8, wherein said forming of said ferroelectric capacitor comprises:

depositing an insulator above said transistor structure;

depositing a lower electrode above said insulator;

depositing a ferroelectric material above said lower electrode; and depositing an upper electrode above said ferroelectric material.

10. The integrated circuit structure in claim 9, wherein said process further comprises, before said depositing of said ferroelectric material, removing a portion of said lower electrode above said transistor structure so as to form a recess in said ferroelectric material and said upper electrode.

11. The integrated circuit structure in claim 9, wherein said process further comprises forming conductive contact openings through said ferroelectric capacitor and forming insulating spacers in said conductive contact openings above said lower electrode to insulate said ferroelectric material and said upper electrode from said conductive contact and to allow said lower electrode to contact said conductive contact.

12. The integrated circuit structure in claim 8, wherein said process further comprises forming an insulator above said ferroelectric capacitor.

13. The integrated circuit structure in claim 8, wherein said ferroelectric material comprises one of $SrBi_2Ta_2O_9$ (SBT) and $Pb(Zr,Ti)O_3$, (PZT).

14. The integrated circuit structure in claim 8, wherein said forming of said conductive contact electrically connects a diffusion region of said transistor and a lower electrode of said ferroelectric capacitor.

* * * * *